US007256079B2

(12) United States Patent
Asano et al.

(10) Patent No.: US 7,256,079 B2
(45) Date of Patent: Aug. 14, 2007

(54) EVALUATION METHOD USING A TEG, A METHOD OF MANUFACTURING A SEMICONDUCTOR DEVICE HAVING A TEG, AN ELEMENT SUBSTRATE AND A PANEL HAVING THE TEG, A PROGRAM FOR CONTROLLING DOSAGE AND A COMPUTER-READABLE RECORDING MEDIUM RECODING THE PROGRAM

(75) Inventors: Etsuko Asano, Kanagawa (JP); Osamu Nakamura, Kanagawa (JP); Masayuki Sakakura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 175 days.

(21) Appl. No.: 10/735,627

(22) Filed: Dec. 16, 2003

(65) Prior Publication Data

US 2005/0196883 A1    Sep. 8, 2005

(30) Foreign Application Priority Data

Dec. 16, 2002  (JP)  ............................. 2002-364411

(51) Int. Cl.
*H01L 21/84*  (2006.01)
(52) U.S. Cl. ...................................... 438/163; 438/151
(58) Field of Classification Search ................ 438/149, 438/151, 157, 163
See application file for complete search history.

(56) References Cited

U.S. PATENT DOCUMENTS

| 5,643,826 | A | 7/1997 | Ohtani et al. | |
|---|---|---|---|---|
| 5,989,945 | A | 11/1999 | Yudasaka et al. | |
| 6,365,933 | B1 | 4/2002 | Yamazaki et al. | |
| 6,461,899 | B1 | 10/2002 | Kitakado et al. | |
| 6,462,802 | B1 * | 10/2002 | Nishimura et al. | ......... 349/147 |
| 6,501,098 | B2 | 12/2002 | Yamazaki | |
| 6,617,644 | B1 | 9/2003 | Yamazaki et al. | |
| 6,759,678 | B2 | 7/2004 | Yamazaki et al. | |
| 6,836,140 | B2 * | 12/2004 | Fujikawa et al. | ........... 324/770 |
| 6,887,724 | B2 * | 5/2005 | Nakamura et al. | ............ 438/14 |

(Continued)

FOREIGN PATENT DOCUMENTS

JP    08-139044    5/1996

OTHER PUBLICATIONS

Mitsumasa Koyanagi, "Submicron Device II", Maruzen Kabushiki Kaisha Shuppan, 1987, pp. 121-142.

(Continued)

*Primary Examiner*—Zandra V. Smith
*Assistant Examiner*—Pamela E Perkins
(74) *Attorney, Agent, or Firm*—Nixon Peabody LLP; Jeffrey L. Costellia (57) ABSTRACT

The reliability of a GOLD structure TFT depends on an impurity concentration in its gate-overlapped region. Thus, it is an object of the present invention to obtain a resistance distribution corresponding to a tapered shape of a gate electrode in a gate-overlapped region. According to the present invention, plural TEGs are manufactured as Lov resistance monitors in which mask alignment is misaligned with several μm interval to perform a resistance measurement on each of the TEGs. Consequently, a resistance distribution corresponding to a tapered shape can be obtained in a channel forming region, a gate-overlapped region and a source/drain region.

30 Claims, 9 Drawing Sheets

U.S. PATENT DOCUMENTS

| | | |
|---|---|---|
| 2001/0052950 A1 | 12/2001 | Yamazaki et al. |
| 2003/0089905 A1 | 5/2003 | Udagawa et al. |
| 2003/0116811 A1 | 6/2003 | Fukui |
| 2003/0122132 A1 | 7/2003 | Yamazaki |
| 2003/0207502 A1* | 11/2003 | Yamazaki et al. .......... 438/149 |
| 2004/0051142 A1 | 3/2004 | Yamazaki et al. |
| 2004/0101989 A1 | 5/2004 | Honda |
| 2005/0017239 A1 | 1/2005 | Nakamura et al. |

OTHER PUBLICATIONS

Masahide Inuishi et al., "A High Performance and Highly Reliable Dual Gate CMOS with Gate/N Overlapped LDD Applicable to the Cryogenic Operation", IEDM, 1989, pp. 773-776.

Takashi Hori, "1/4-μm Latid (*LA*rge-*T*ilt-angle *I*mplanted *D*rain) Technology for 3.3-V Operation", IEDM 1989, pp. 777-780.

* cited by examiner

EVALUATION METHOD USING A TEG, A METHOD OF MANUFACTURING A SEMICONDUCTOR DEVICE HAVING A TEG, AN ELEMENT SUBSTRATE AND A PANEL HAVING THE TEG, A PROGRAM FOR CONTROLLING DOSAGE AND A COMPUTER-READABLE RECORDING MEDIUM RECODING THE PROGRAM

BACKGROUND OF THE INVENTION

1. Technical Field of the Invention

The present invention relates to an evaluation method of a thin film transistor or a method of manufacturing the same, or a method of manufacturing a semiconductor device having the thin film transistor. Further, the present invention relates to a program or a recording medium to control a quantity of impurities to be added based on the evaluation method.

2. Description of the Related Art

A characteristic deterioration phenomenon due to hot carriers is given as a physical phenomenon about life expectancy in a semiconductor element typified by a thin film transistor (hereinafter, referred to as a TFT). A hot carrier is caused by a hole and an electron in a nonequilibrium state that exceeds a temperature of a lattice system, and particularly, the electron is called a hot electron. As a size of a device becomes smaller, a local electric field becomes larger. A malfunction or a decrease of an operation function of a semiconductor device, or reduction of drain current to drain voltage is caused by the thus generated hot carriers, which makes a device property or performance of a semiconductor device deteriorate.

Herein, a phenomenon of deterioration by a hot electron is described. When a semiconductor element is operated, a high electric field region is formed in a drain region, specifically, in the vicinity of a junction region of a channel forming region and the drain region. The electron that has flowed into this high electric field region becomes a hot electron having a extremely high energy. At this time, a portion of the hot electrons are injected into a gate oxide film, or generate an interface level on Si—$SiO_2$ interface, thereby changing an element characteristic. In addition, there is not only a hot electron of the channel electron but also a substrate hot electron.

Further, there is injection of a carrier which is generated by collision ionization or avalanche multiplication into an oxide film as a hot carrier (Drain Avalanche Hot Carrier: DAHC) and a hot electron injection generated by secondary collision ionization (Secondarily Generated Hot Electron: SGHE). Note that details thereof are described in submicron device II p. 121 to 142 (written by Mitsumasa Koyanagi, Maruzen Co., Ltd.).

As a method for preventing a deterioration due to such a hot carrier, it is known a Lightly Doped Drain (LDD) structure TFT which is provided a region added an element of impurity at low concentration (a first low concentration impurity region) between a channel forming region and a source region or drain region.

Further, as a method for preventing performance reduction due to parasitic resistance of an LDD region, it is known a Gate-Overlapped LDD (GOLD) structure TFT which is arranged an gate-overlapped region overlapping LDD region with a gate electrode across a gate insulating film (a second low concentration impurity region). It is known that high electric field of a drain vicinity is relieved to be prevented hot carrier injection by using these structure like this, which is effective for preventing a deterioration phenomenon.

The reliability of this GOLD structure TFT greatly depends on an impurity concentration in a gate-overlapped region. When an impurity concentration of an gate-overlapped region is high, a strong electric field generates on an interface of a channel forming region and the gate-overlapped region, a generation quantity of hot carriers becomes large, and characteristics deterioration of a TFT such as on-state current reduction is serious.

On the other hand, in case that an impurity concentration of a gate-overlapped region is reduced to some extent, as an electric field intensity of an interface between a channel forming region and a gate-overlapped region decreases, an electric field intensity of an interface between a drain region and the gate-overlapped region increases. However, it is desirable that a maximum of an electric field becomes small and characteristics deterioration of a TFT becomes small.

However, when the impurity concentration of the gate-overlapped region is further lowered, a strong electric field generates on the interface between the drain region and the gate-overlapped region. Thus, even when the impurity concentration of the gate-overlapped region is low, characteristics deterioration of a TFT increases. Therefore, it is important to grasp an impurity concentration of a gate-overlapped region more precisely to improve reliability of a semiconductor element.

And so, a method for estimating an impurity introduction in consideration of a dosage dependence and an impurity concentration distribution of a thermal diffusion area by a simulation has been used in an LSI field. This is a method for simulating by a step including a calculation of an impurity concentration distribution of an impurity diffused region based on a total amount of introduced impurities, in the case where impurities are introduced into a semiconductor substrate, and the impurities are diffused by a heat treatment to obtain the impurity diffused region. (Refer to Patent Document 1: Japanese Patent Laid-Open No. Hei 8-139044.)

Specifically, a method for forming only a lower conductive film over a semiconductor film and then measuring resistance of a measurement element that has been formed by adding impurities thereinto, in order to grasp an impurity concentration of a gate-overlapped region (Lov region) that is overlapped with only the lower conductive film of a gate electrode has been employed in a field of a thin film transistor. In this case, only an element for measuring resistance of a gate-overlapped region is formed over another substrate, or the number of masks is increased to form an element for measuring resistance in a portion of substrate.

However, it is difficult to precisely measure resistance of a Lov region in this method, since a gate electrode of a gate-overlapped region formed in a self-alignment process is subjected to taper-etching and anisotropic etching, as well as increasing the number of the steps. This is because a TFT and a measurement element cannot be formed over the same substrate and in the same process.

Thus, it is an object of the present invention to provide a method for manufacturing an element for measuring Lov resistance, an evaluation method using the element for measuring Lov resistance, an element substrate and a panel having the element for measuring Lov resistance.

SUMMARY OF THE INVENTION

In view of above described object, the present invention is characterized by forming a TEG (a group of elements for evaluation; Test Element Group) having a test element (an evaluation element for measuring an impurity concentration of a gate-overlapped region is referred to as a Lov resistance monitor, in particular).

Particularly, it is characterized in that alignment of a mask (mask alignment) to be used in manufacturing a gate electrode of a Lov resistance monitor is misaligned daringly to manufacture it, and impurity concentrations of respective regions are grasped precisely by obtaining a sheet resistance distribution in accordance with a source/drain region (a high concentration impurity region), a gate-overlapped region and a channel forming region.

In addition, the present invention is characterized in that misalignment of a mask is evaluated by measuring an electric characteristic of a Lov resistance monitor without an observation with a SEM or the like. Note that misalignment of a mask of a single gate structure can be also evaluated besides a GOLD structure, for example.

DETAILED DESCRIPTION OF THE PREFERRED EMBODIMENTS

Figure 01:
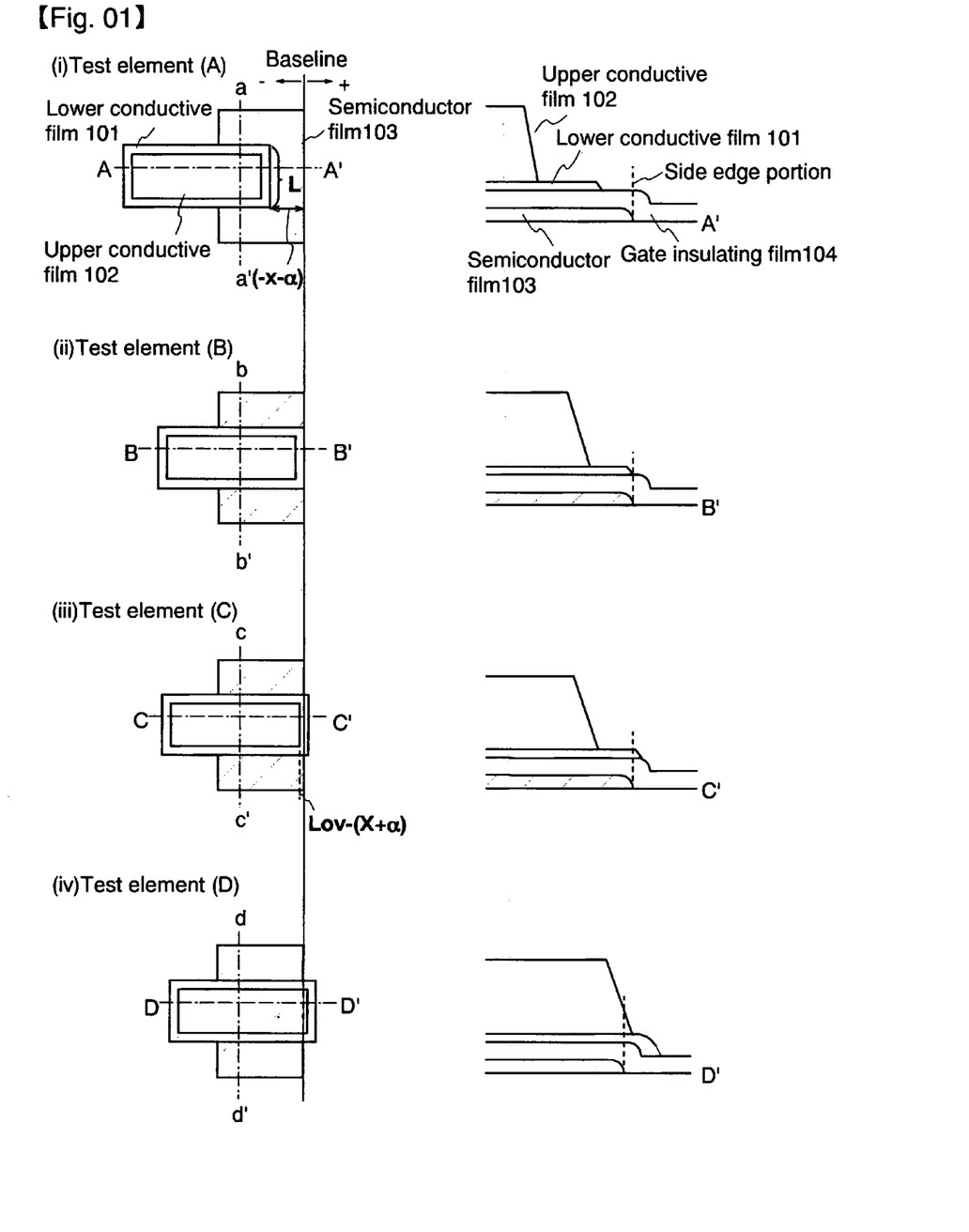
FIG. 1 shows a TEG of the present invention.

Specifically, as shown in FIG. 1, evaluation elements (A) to (D) are manufactured as a Lov resistance monitor, in which mask alignment is misaligned with a sub μm interval, and resistance measurement is performed on them. Each gate electrode of the test elements has a laminated structure of a lower conductive film (a first conductive film) 101 and an upper conductive film (a second conductive film) 102, and has a structure in which an edge of the lower conductive film extends out of an edge of the upper conductive film.

The test element (A) constitutes a Lov resistance monitor to measure sheet resistance of a source/drain region. It is provided so that edges of a lower conductive film 101 and an upper conductive film 102 do not extend out of a side edge portion of a semiconductor film 103 (one of edges which is parallel with the direction that carriers flow in FIG. 1), seen in a top face or a magnified view of a cross-sectional view taken along A-A'.

The test element (B) constitutes a Lov resistance monitor to measure sheet resistance of a gate-overlapped region. It is provided so that an edge of a lower conductive film 101 is aligned with a side edge portion of a semiconductor film 103, seen in a top face or a magnified view of a cross-sectional view taken along B-B'.

A test element (C) also constitutes a Lov resistance monitor to measure sheet resistance of a gate-overlapped region. It is provided so that a side edge portion of a semiconductor film 103 exists between an edge of a lower conductive film 101 and an edge of an upper conductive layer 102, seen in a top face or a magnified view of a cross-sectional view taken along C-C'.

The test element (D) constitutes a Lov resistance monitor to measure sheet resistance of a channel forming region. It is provided so that an edge of upper conductive film 102 is aligned with a side edge portion of a semiconductor film, or the edge of the upper conductive film 102 and an edge of a lower conductive film 101 extend out of the side edge portion of the semiconductor film 103, seen in a top face or magnified view of a cross-sectional view taken along D-D'.

Next, a measurement of sheet resistance is described. For example, when the test element (A) is used and sheet resistance in a source/drain region is measured, it is understood that the sheet resistance is proportional to $1/(-X-\alpha)$, since it is proportional to the length L and inversely proportional to the width W. Here, the X shows a condition that a mask alignment is daringly misaligned (an alignment condition), and the a shows misalignment of a mask alignment (misalignment), how much masks are misaligned to form respective evaluation elements.

The misalignment a can be obtained by using these characteristics, and sheet resistance of a gate-overlapped region and the like can be calculated by using the calculated a. In addition, misalignment of a mask can be evaluated by measuring electric characteristics without observing with an optical microscope, a SEM or the like, according to the present invention.

Figure 08:
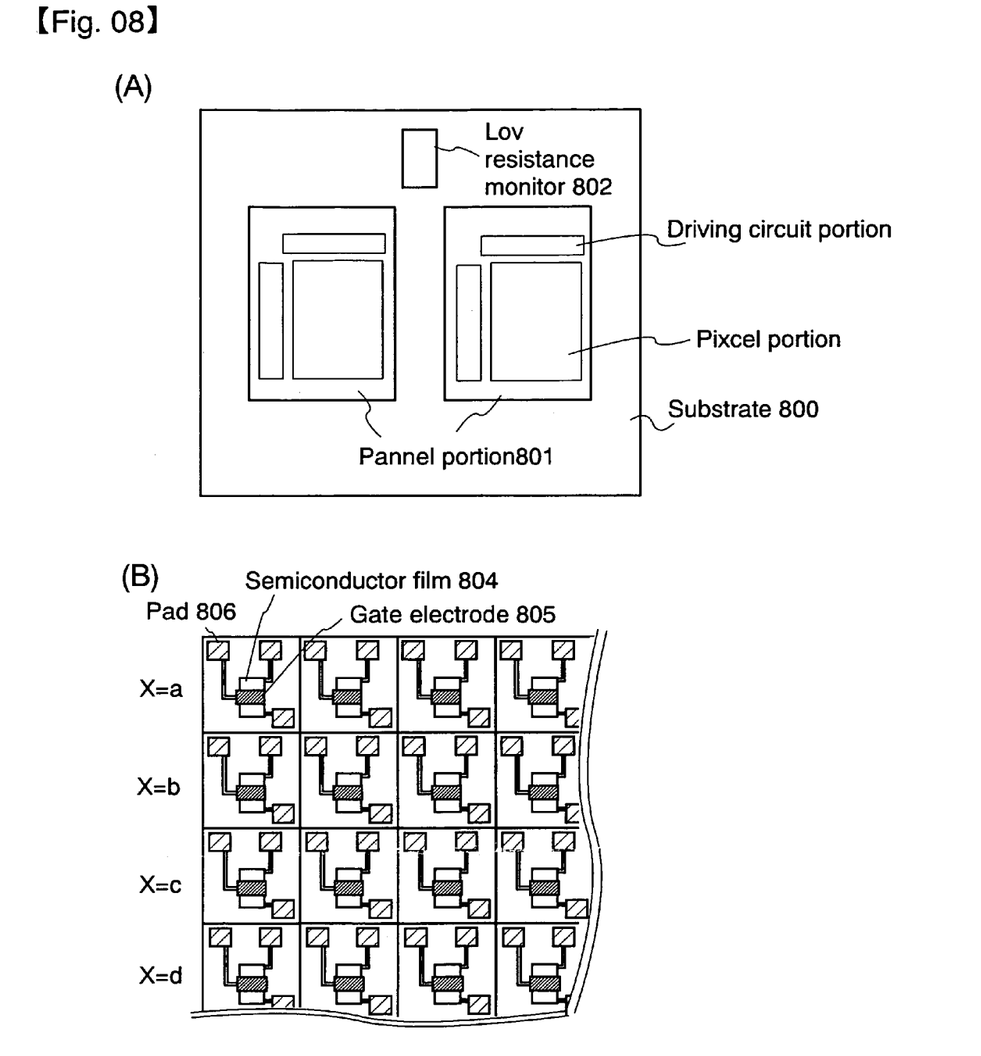
FIG. 8 shows a TEG of the present invention.

FIG. 8(A) shows a substrate 800 over which a panel portion 801 in which a TFT element is provided (a region that is used as a panel over a substrate and that includes a pixel portion and a driver circuit portion) and a Lov resistance monitor 802 are formed. The present invention is characterized in that a TEG such as a Lov resistance monitor and a TFT can be formed over the same substrate like this. In other words, evaluation of a low concentration impurity region formed in a gate-overlapped region can be grasped precisely, since taper etching or anisotropic etching can be performed simultaneously on a gate electrode of TFT and a gate electrode of a TEG such as a Lov resistance monitor.

In addition, FIG. 8(B) shows a magnified view of a Lov resistance monitor. The Lov resistance monitor 802 has a TEG having a Lov resistance monitor formed a pad which includes semiconductor film 804 and a gate electrode 805 and which is connected with a gate electrode, source electrode, and drain electrode. And an alignment condition of a test element of the Lov resistance monitor is set, so the alignment condition is set as X=a, b, c, d in FIG. 8(B).

A resistance distribution of a gate-overlapped region corresponding to a tapered shape of a gate electrode can be obtained by measuring sheet resistance of a Lov resistance monitor formed like this, which cannot be obtained in a conventional manner. In other words, according to the present invention, it is possible to precisely grasp impurity concentrations of a gate-overlapped region, a source/drain region and a channel forming region.

In addition, the present invention can compile the obtained resistance distribution into a database, and select the most suitable quantity of impurities to be added, in various design conditions of a circuit or the like. And the present invention can provide a program to be selected from a database, or a recording medium which can be read by a computer, and can obtain a desired quantity of impurities to be added (a dosage) in a short time, without depending on an experience of a practitioner. And a method for manufacturing of a semiconductor device which output the obtained dosage to a doping apparatus and design a device having desired characteristics efficiently (design control system) can be provided.

In addition, according to the invention, misalignment of a mask can be evaluated precisely without observing with a SEM, by calculating misalignment a from measurement electric characteristics of a TEG such as a Lov resistance monitor. In this case, the TEG such as a Lov resistance monitor may be a so-called LDD structure having a Lightly Doped Drain (LDD) region in which a region added with impurities at a lower concentration than a source drain region (a low concentration impurity region), may be a so-called GOLD structure in which an LDD region overlaps a gate electrode, or may be a so-called single drain structure without a low concentration impurity region.

And the present invention can provide an element substrate having a TEG such as a Lov resistance monitor like this, a panel and a method for manufacturing them. A panel is a panel of a display device that is mounted on a display portion of a semiconductor device such as a display device having a liquid crystal device (a liquid crystal display device), or a display device having a light-emitting element (a light-emitting device), and the panel has a pixel portion or a driver circuit portion. Of course, in a step of completing as a panel, there is a case where a TEG such as a Lov resistance monitor is cut and removed.

Hereinafter, embodiment modes of the present invention will be described with reference to the drawings. Note that an impurity to be doped into a gate-overlapped region in evaluating a Lov resistance monitor to be described in Embodiment Mode hereinafter may be either an acceptor or a donor.

EMBODIMENT MODE 1

This Embodiment Mode concretely describes a method of manufacturing evaluation elements (A) to (D) of a Lov resistance monitor, and a way of obtaining sheet resistance in a source/drain region, a gate-overlapped region, and a channel forming region.

Figure 02:
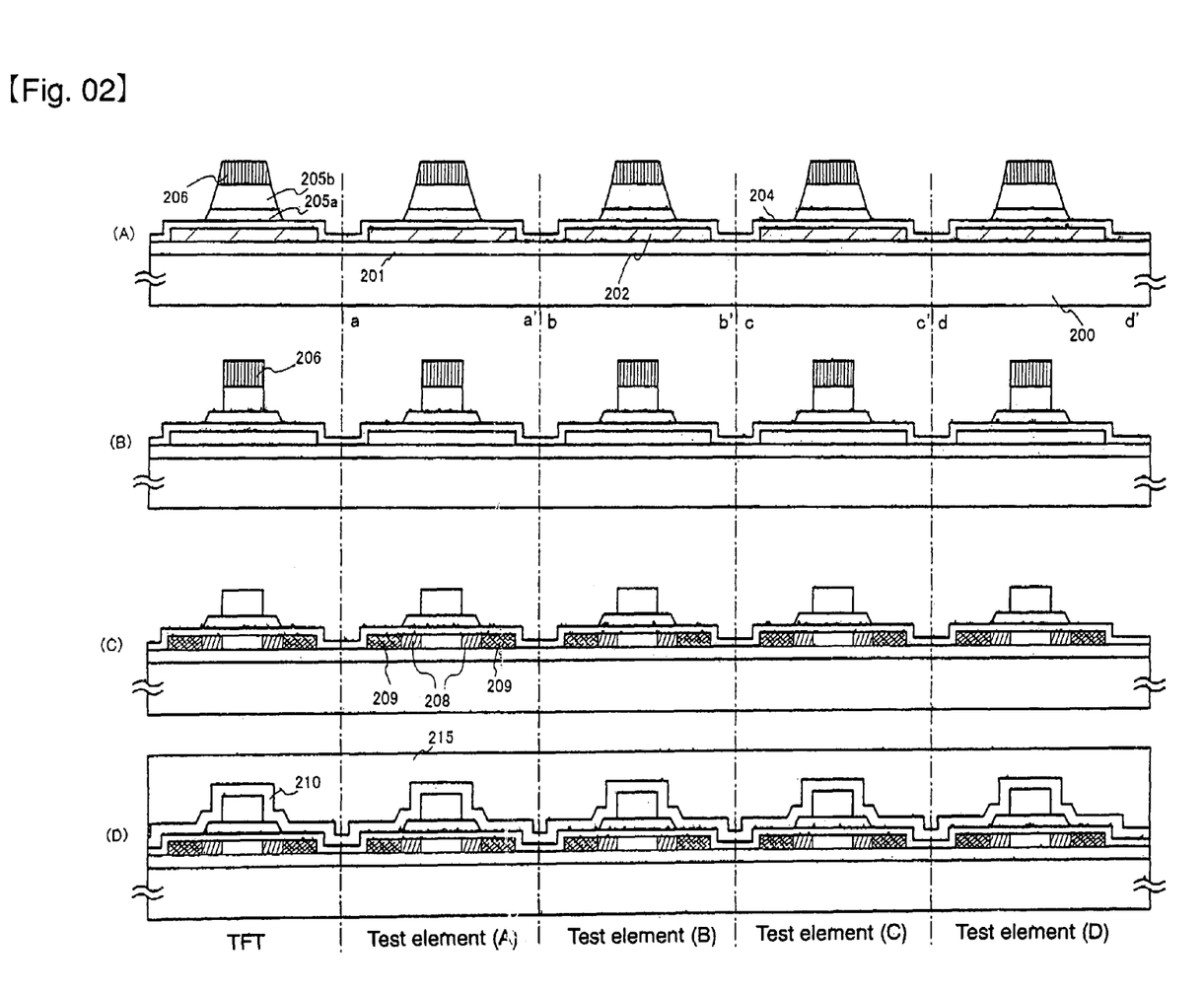
FIG. 2 shows a manufacturing step of a TEG of the present invention.

FIG. 2 shows a GOLD structure TFT (hereinafter, referred to as a TFT) provided for a panel portion, and manufacturing steps of the test elements (A) to (D) shown in FIG. 1 and cross-sectional views seen from a-a', b-b', c-c', d-d'. First, as shown in FIG. 2(A), a base film 201 is formed to prevent penetration of impurities from a substrate, over the substrate having an insulating surface (an insulating substrate) 200.

And impurities are added into a crystallized semiconductor film 202 over the base film in order to control a threshold value (channel dope), a gate insulating film 204 is formed, a TaN film 205a as a lower portion conductive film of a gate electrode and a W film 205b as an upper portion conductive film thereof are formed. Then, a first resist 206 is formed over the W film, and taper etching is performed on the W film 205a and the TaN film 205b.

After that, the W film is etched by anisotropic etching to form the gate electrode without removing the resist 206 as shown in FIG. 2(B).

Then, as shown in FIG. 2(C), a phosphorus (P) ion is injected so as to form a source/drain region 209 and a gate-overlapped region 208. Note that in this Lov resistance monitor, the source/drain region and the gate-overlapped region are doped simultaneously.

And, as shown in FIG. 2(D), a passivation film 210 and an interlayer insulating film 215 are formed.

As described above, a resistance measurement is performed on a Lov resistance monitor that is a TEG formed on the same time and substrate as a TFT.

Next, a resistance measurement is described. Note that alignment conditions are misaligned with an interval of 0.5 μm like every 0, ±0.5, ±1.0, ±1.5, ±2.0, when the right side of the baseline shown in FIG. 1 is regarded as a plus and the left side of the baseline is regarded as a minus, in respective Lov resistance monitors to be measured in this embodiment mode.

First, when each resistance of the channel forming region and the gate-overlapped region are ignored in the test element (A), $$R_1 = R_{SD} \cdot L / (-X_1 - \alpha) \quad (1)$$

$$R_2 = R_{SD} \cdot L / (-X_2 - \alpha) \quad (2)$$

are obtained. Note that $X_1$ and $X_2$ are each an alignment condition in which an mask alignment is misaligned daringly, $R_1$ and $R_2$ are each resistance value measured by the $X_1$ and $X_2$, $R_{SD}$ is a sheet resistance of a source/drain region, L is a width of a lower portion conductive film, α is misalignment of a mask. It should be noted that the L is much larger than that of the gate-overlapped region.

According to the above equations (1), (2)

$$\alpha = (-R_1 \cdot X_1 + R_2 \cdot X_2) / (R_1 - R_2) \quad (3)$$

Because of the equality of the equation (3), the misalignment α can be calculated by substituting a measured value R and an alignment condition X in this equation. In other words, the equation (4) is obtained.

$$R_{SD} = R(-X - \alpha) / L \quad (4)$$

Note that in the test element (A), the misalignment a of a mask is α P 0.3.

In addition, when resistance in the channel forming regions are ignored in the test elements (B) and (C), the next equation is obtained.

$$R = R_{LOV} \cdot L / \{L_{LOV} - (X + \alpha)\} \quad (5)$$

Note that $R_{LOV}$ indicates sheet resistance of the gate-overlapped region, and $L_{LOV}$ indicates a length of the gate-overlapped region.

From the equation (5), $$R_{LOV} = R(L_{LOV} - X - \alpha) / L \quad (6)$$

is obtained.

Further, in the test element (D), the next equation is obtained.

$$R = R_{ch} \cdot L / W \quad (7)$$

Note that $R_{ch}$ indicates sheet resistance of the channel forming region.

From the equation (7), $$R_{ch} = R \cdot W / L \quad (8)$$

is derived.

Sheet resistance of the respective regions can be obtained from the equations (4), (6) and (8) as described above.

Figure 4:
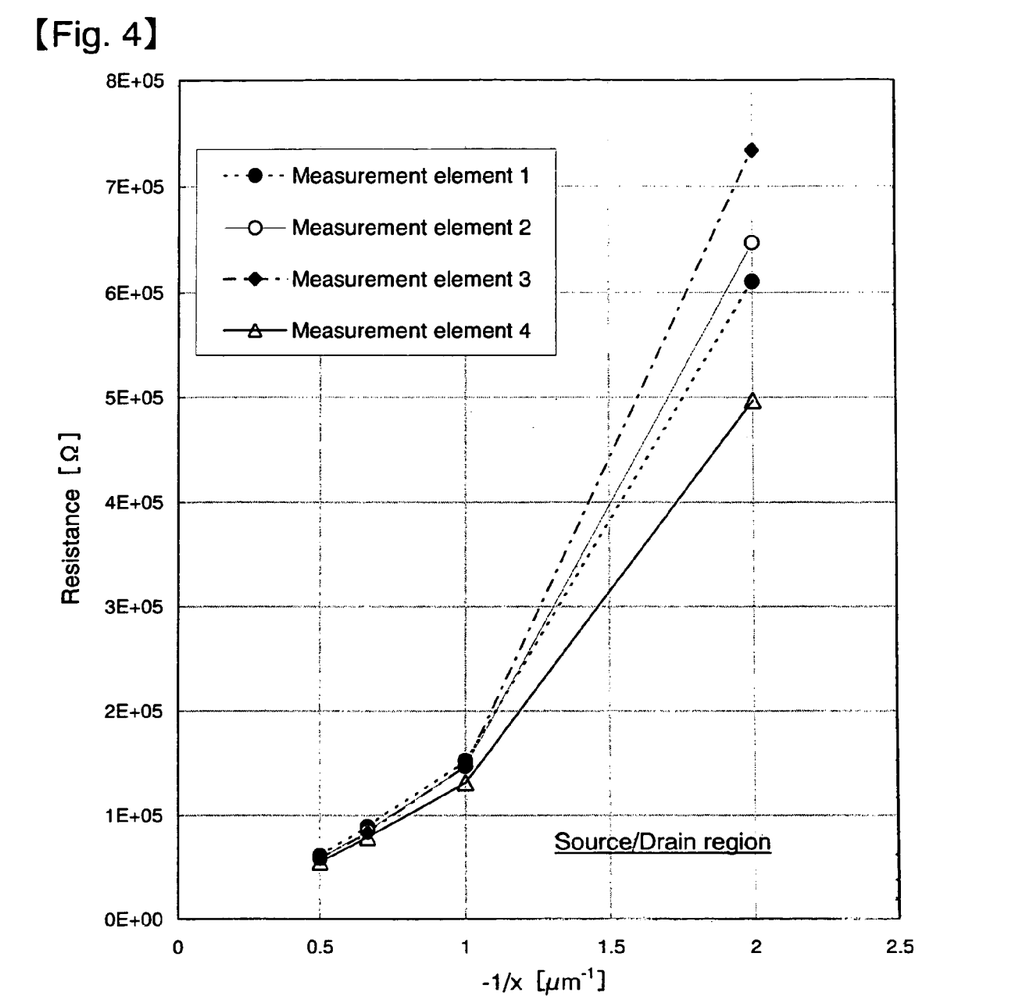
FIG. 4 shows an experimental result of the present invention.
Figure 5:
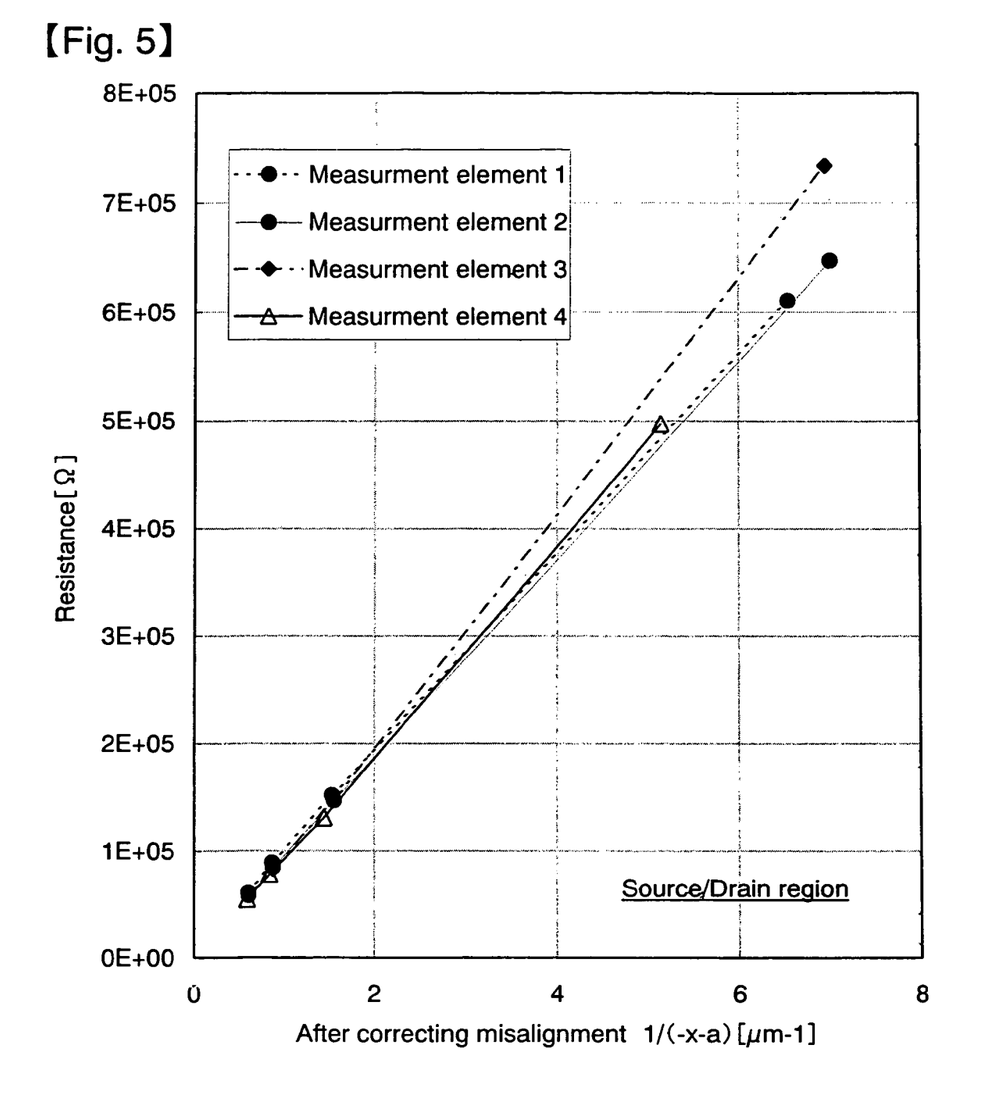
FIG. 5 shows an experimental result of the present invention.

And FIGS. 4 and 5 each show sheet resistance of a source/drain region by using ones (measurement element 1, 2) in which a channel dope quantity is $1.8 \times 10^{13}$ ions/cm$^2$, and ones (measurement element 3, 4) in which a channel dope quantity is $1.5 \times 10^{13}$ ions/cm$^2$, and each of which has a structure shown by the test element (A). Note that FIG. 4 is a case where correction of misalignment of a mask is not considered, and FIG. 5 is a graph in which correction of misalignment of a mask calculated from the equation (4) is considered.

Before the correction shown in FIG. 4, resistance R does not have a proportionality relation with $-1/X$, but resistance R has a proportionality relation with $-1/(-X-\alpha)$ by correcting misalignment of a mask as shown in FIG. 5. Thus, it can be confirmed that the calculated a is right. As apparent from FIG. 5 or $R=(L/R_{SD})\cdot(1/-X-\alpha)$ which is changed from the equation (4), a correlation that the resistance R has a proportionality relation with $(1/-X-\alpha)$ can be obtained, according to the present invention.

Figure 6:
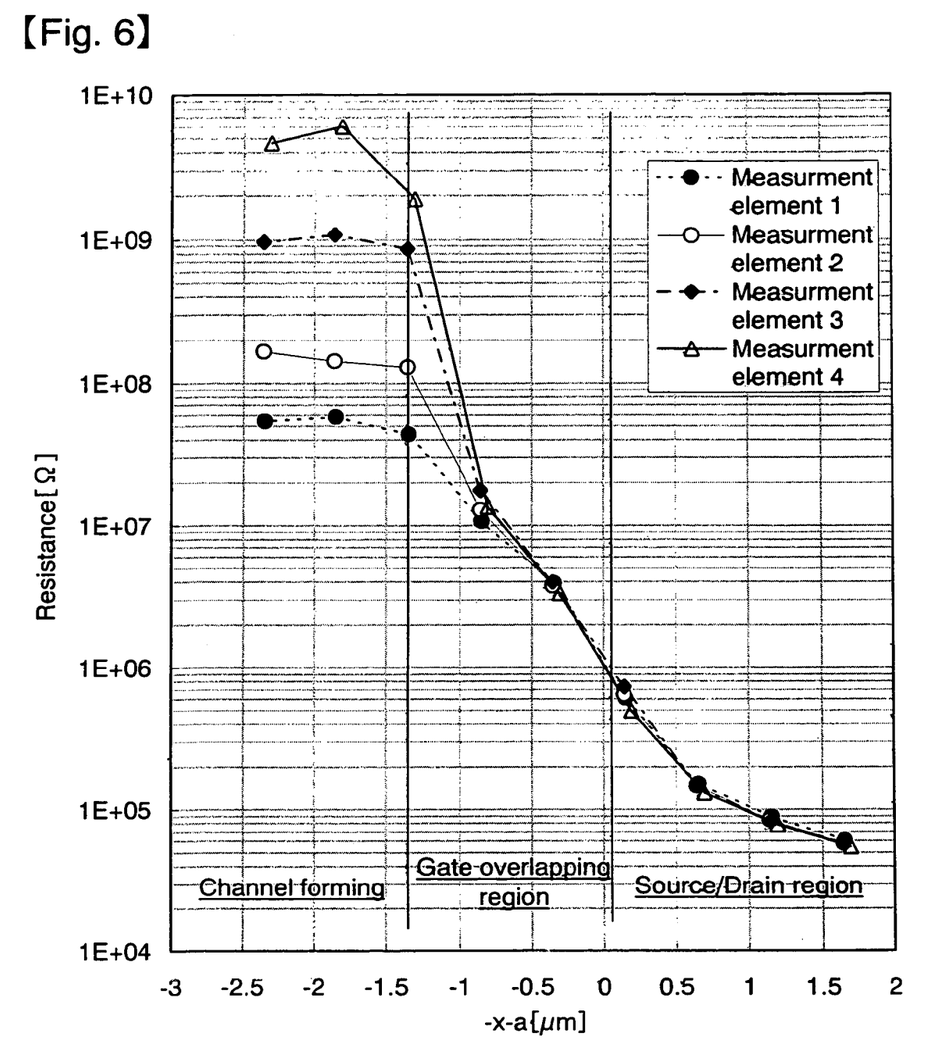
FIG. 6 shows an experimental result of the present invention.
Figure 7:
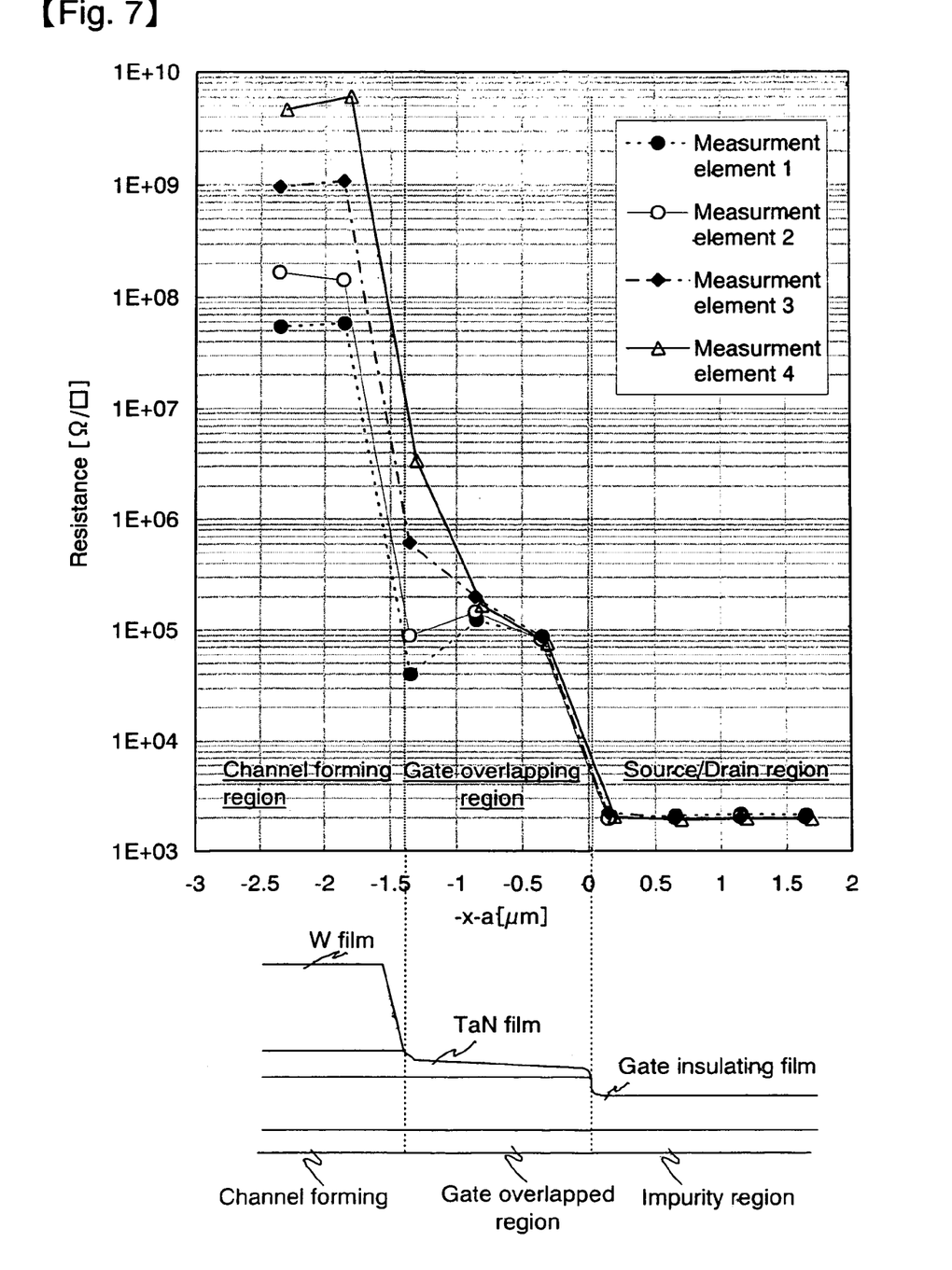
FIG. 7 shows an experimental result of the present invention.

In addition, by the misalignment a of a mask and the equations (4), (6) and (8), resistance distribution in a channel-length direction of the channel forming region corresponding to a tapered shape of the gate electrode, the gate-overlapped region and the source/drain region can be obtained precisely as shown in FIG. 6. Further, a graph in which the resistance of FIG. 6 is converted into sheet resistance is shown in FIG. 7.

Resistance of a gate-overlapped region has been calculated only as an average value by a conventional method, since it does not correspond to a tapered shape of a gate electrode. However, a resistance distribution corresponding to a tapered shape of a gate electrode can be obtained according to the present invention. As apparent from FIG. 7, the present invention shows sheet resistance corresponding to a taper of a gate-overlapped region precisely, and as compared with a conventional method using this as an average value, correct electric characteristics can be obtained.

In addition, since, in particular, a reliability of a GOLD structure depends greatly on an impurity concentration of a gate-overlapped region, it is a measure of a life time of a TFT to use an obtained sheet resistance value of the gate-overlapped region, without performing a long term reliability test.

EMBODIMENT MODE 2

According to the present invention, it is possible that real misalignment is measured by an electric characteristics measurement using characteristics of the misalignment α of a mask of the test element. The real misalignment indicates misalignment from designed location due to shrinkage of a substrate or the like. This misalignment can be evaluated precisely by calculating from an electric characteristics measurement by using misalignment α. At this time, a TEG or a TFT may be, for example, a simple single drain structure (in which a low concentration impurity region is not provided), besides a GOLD structure. In other words, the real misalignment can be evaluated with a test element which is laminated with a semiconductor film and a conductive film forming a gate electrode, and which is misaligned with α from a baseline.

In this embodiment mode, a method for measuring real misalignment by an electric characteristics measurement is described.

Shrinkage or expansion of substrate due to a heating step is grasped by arranging plural evaluation elements over a substrate, preferably in four angles of a substrate. In other words, evaluation elements as shown in FIG. 8B are arranged in four angles of a substrate, and misalignment α of a mask of each evaluation element is calculated after a heat treatment for activation or the like. And then, shrinkage or expansion of the substrate can be evaluated from the difference between them, also real misalignment can be evaluated. Note that a TEG that rotates a direction of the TEG shown in FIG. 8(B) at 90 degrees can be formed in each line to calculate misalignment of an X-axis and a Y-axis direction at this time.

Figure 09:
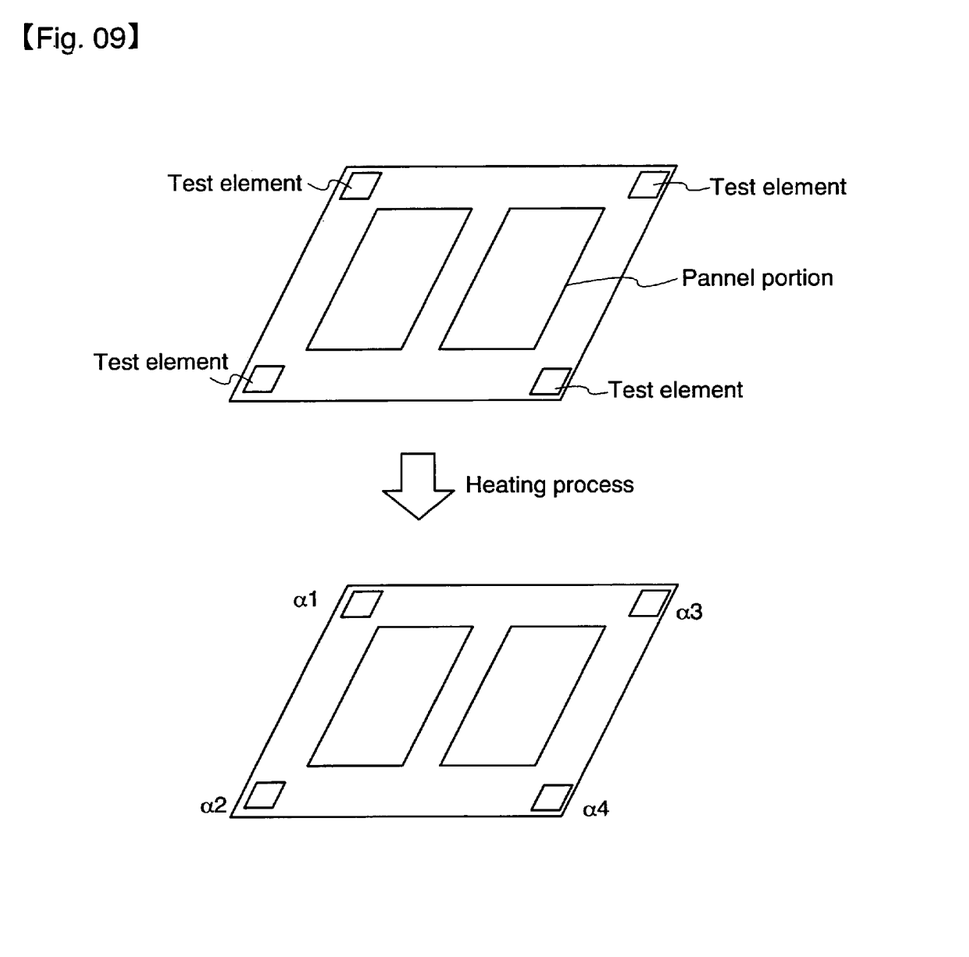
FIG. 9 shows an evaluation method of misalignment of a mask according to the present invention.

For example, shrinkage or expansion of a substrate can be evaluated from the difference between misalignment α1 and α2 and from that between misalignment α3 and α4 of the test elements which are formed in the four angles of the substrate as shown in FIG. 9. Note that the obtained shrinkage or expansion of a substrate may be 15 to 20 ppm or less.

Like this, misalignment of a maks can be evaluated precisely by obtaining alignment a by a measurement of electric characteristics of a TEG, without observing with a SEM or the like.

EMBODIMENT MODE 3

Figure 03:
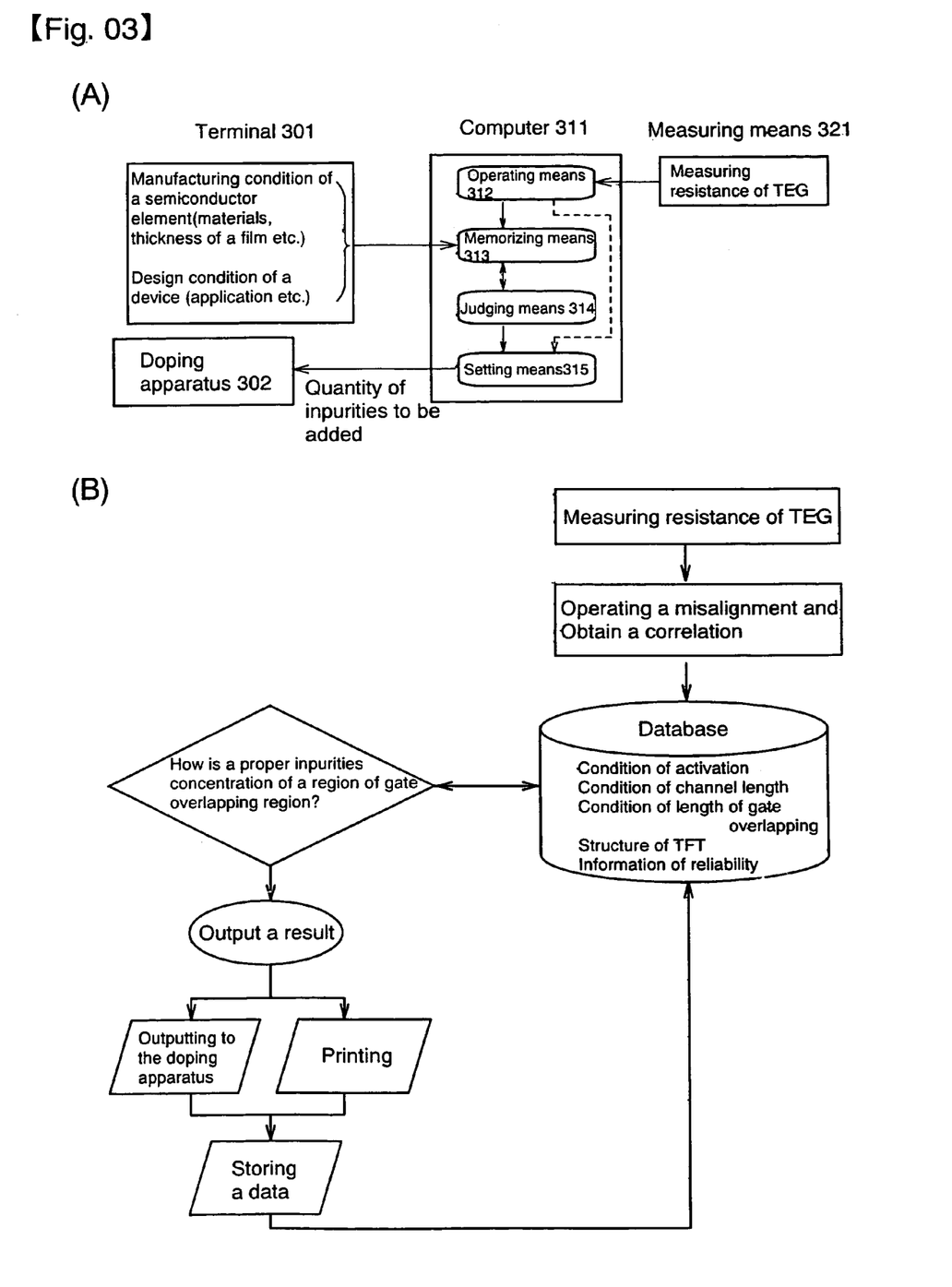
FIG. 3 shows a computer system of the present invention.

This embodiment mode describes a computer system which compiles conditions such as a sheet resistance value of a gate-overlapped region and that of length dependence of the channel-length direction (a gate overlap length condition), a activation condition dependence, a length dependence of a channel-length direction of an active layer (a channel-length condition), a TFT structure, and a condition of reliability in a database and controls a quantity of impurities to be added (a dosage) with reference to FIG. 3.

FIG. 3(A) shows a constitution of a computer system and it has a terminal 301, a doping apparatus 302, a computer 311 and measuring means 321.

The terminal 301 includes a unit to input a manufacturing condition of a semiconductor element or a design condition of a device (one having a predetermined function by gathering plural semiconductor elements, e.g. a shift register, a signal line driver circuit or the like) and the like. Note that a personal digital assistant (PDA), a computer or the like may be used for the terminal 301. And the terminal 301 and the doping apparatus 302 are provided in a place for manufacturing a device (e.g. a clean room).

Various computers such as a personal computer, a workstation, a mainframe computer are included in the computer 311. The computer includes a hardware unit, which is provided with a general computer, such as a central processing unit (CPU), a main memory unit (main memory: RAM), a coprocessor, an image accelerator, a cache memory, an input-output control unit (I/O) and the like. In addition, an external memory storage device such as a hard disc device and the like, a communication means such as Internet and the like can be provided.

In addition, a measuring means 321 has a function for measuring resistance of a TEG.

And the computer 311 includes a computing unit 312 for calculating misalignment of a mask from a resistance value measured by the measuring means 321 and obtaining resistance distribution, a memory unit 313 by which a condition of a semiconductor element or a device that is inputted from the terminal, and reliability information such as an optimum resistance value of a gate-overlapped region is inputted, and the condition is compiled into a database and memorized, a judging unit 314 for judging and selecting an optimum quantity of impurities to be added from the database, and a setting unit 315 for setting the selected quantity of the impurities to be added in the doping apparatus. Note that the computer 311 may have an output unit that can output a predetermined quantity to be added by printing or displaying. In addition, preferably a unique condition of each doping apparatus is memorized in the memory unit 313, and the most suitable quantity to be added may be selected by the judging unit 314.

And when an optimum quantity to be added is selected from the database (the path shown in the solid line), the judging unit 314 is allowed to judge and select an optimum quantity to be added, based on a correlation obtained by the computing unit 312 or a condition memorized by the memory unit 313, and the doping apparatus 302 is allowed to set the quantity to be added by the setting unit 315.

Alternatively, when a quantity to be added is set by using a measured resistance value (the path shown by the dotted lines), the computing unit 312 is allowed to calculate misalignment of a mask and obtain a correlation to confirm a precise resistance distribution based on resistance obtained from the measuring means 321, and the doping apparatus 302 may be allowed to set the quantity to be added based on the correlation obtained by the setting unit 315.

The computer 311 like this may be provided in a place for manufacturing a device or in another place. When it is provided in another place, each condition of the terminal 301 may be inputted into the judging unit 314 via a network. Also, the measuring means 321 may be provided in a place for manufacturing a device or in another place. When it is provided in another place, each result by the measuring unit may be inputted into the computing unit 312 via a network. In addition, the measuring means 321 and the computer 311 may be provided in the same place.

Next, by using a flow chart shown in FIG. 3(B), a system flow about the path shown in the solid line is described. First, resistance of the test elements (A) to (D) formed under each condition are measured, the computer is allowed to calculate misalignment a based on the resistance to obtain a correlation of the resistance and $(-X-\alpha)$. The database in which these forming condition (typically, a condition for activation, a channel-length condition, a gate overlap condition, a reliability condition and other conditions, or a TFT structure), a resistance value, misalignment $\alpha$, etc, are stored, is accessed, and an optimum impurity concentration of a gate-overlapped region is judged and selected according to a required way of using a device.

After that, the result of the selected quantity to be added is displayed, and the quantity to be added may be set in the doping apparatus or printed and outputted. Moreover, the obtained data of the quantity to be added or the like may be stored and memorized in the database.

Such a computer system may be manufactured by using software such as a program or hardware. And the computer system may be provided for the doping apparatus, and may be performed through network communication.

By the above described computer system to control a quantity to be added, a quantity of impurities to be added can be determined efficiently. And further, by the computer system of the present invention, a constant result can be obtained in a short time regardless of an experience of a practitioner.

Further, if a correlation of an impurity concentration, reliability and an initial characteristic of a gate-overlapped region is compiled into a database, it can be made a standard of judgment for estimating a life time by evaluating TEG For example, in a mass production factory, it is difficult to conduct a reliability evaluation (deterioration test), which takes a lot of time, but deterioration can be evaluated by using a resistance measurement result as a standard of judgment.

According to the present invention, a TEG having a test element on a portion of a TFT substrate can be manufactured, etching such as tapered etching is performed on a TFT element and the test element simultaneously, and thus, a resistance of a Lov region, that is, an impurity concentration of the Lov region can be more precisely grasped than a test element formed another substrate.

In addition, an optimum quantity of impurities to be added can be obtained in a short time without relying on an experience of a practitioner by compiling an impurity concentration or a forming condition and a correlation of reliability and them by a semiconductor element obtained by the present invention into a database. Further, deterioration can be evaluated based on by using a resistance measurement result as a standard of judgment.

What is claimed is:

1. An evaluation method of a TFT comprising:
   a step of forming a TAG and the TFT over a same substrate, each having a gate electrode which is formed to have a first conductive film over a semiconductor film and a second conductive film over the first conductive film, the semiconductor film having a low concentration impurity region overlapping the gate electrode,
   a step of measuring resistance of the low concentration impurity region of the TEG, and
   estimating an impurity concentration of the low concentration impurity region of the TFT by the resistance,
   wherein etching is performed simultaneously on the gate electrode of the TEG and the gate electrode of the TFT,
   wherein an edge of the first conductive film extends beyond an edge of the second conductive film, and
   wherein a side edge portion of the semiconductor film is provided between the edge of the first conctuctive film and the edge of the second conductive film.

2. The evaluation method of the TFT according to claim 1, wherein in the TEG, a correlation of the resistance and an overlapping position of the first conductive film or the second conductive film and the semiconductor film is obtained.

3. The evaluation method of the TFT according to claim 1, wherein the TEG has a test element for measuring resistance of the low concentration inpurity region.

4. A method of manufacturing a semiconductor device characterized by having a TFT manufactured by using the evaluation method as recited in claim 1.

5. The evaluation method of the TFT according to claim 1, wherein the low concentration impurity region is provided between a channel forming region and a source region or drain region in the semiconductor film.

6. An evaluation method of a TFT comprising:
a step of forming a TEG and the TFT over a same substrate, each having a gate electrode that is laminated with a first conductive film and a second conductive film over a semiconductor film which has a low concentration impurity region overlapping the gate electrode,
a step of measuring resistance of the low concentration impurity region of the TEG, and estimating an impurity concentration of the low concentration impurity region of the TFT by the resistance,
wherein an edge of the first conductive film extends beyond an edge of the second conductive film, and
wherein a side edge portion of the semiconductor film is provided between the edge of the first conductive film and the edge of the second conductive film.

7. The evaluation method of the TFT according to claim 6, wherein the first conductive film is formed from a TaN film and the second conductive film is formed from a W film.

8. The evaluation method of the TFT according to claim 6, wherein in the TEG, a correlation of the resistance in the TEG and an overlapping position of the first conductive film or the second conductive film and the semiconductor film is obtained.

9. The evaluation method of the TFT according to claim 6, wherein the TEG has a test element for measuring resistance of the low concentration impurity region.

10. A method of manufacturing a semiconductor device characterized by having a TFT manufactured by using the evaluation method as recited in claim 6.

11. The evaluation method of the TET according to claim 6, wherein the low concentration impurity region is provided between a channel forming region and a source region or drain region in the semiconductor film.

12. An evaluation method of a TFT comprising:
a step of forming a TEG and the TFT over a same substrate, each having a gate electrode with a taper which is formed to have a first conductive film over a semiconductor film and a second conductive film over the first conductive film, the semiconductor film having a low concentration impurity region overlapping the taper of the gate electrode,
a step of measuring resistance of the low concentration impurity region of the TEG, and
estimating an impurity concentration of the low concentration impurity region of the TFT in accordance with the taper by the resistance,
wherein the gate electrode with the taper is formed by taper etching, which is performed simultaneously on the gate electrode of the TEG and the gate electrode of the TFT,
wherein an edge of the first conductive film extends beyond an edge of the second conductive film, and
wherein a side edge portion of the semiconductor film is provided between the edge of the first conductive film and the edge of the second conductive film.

13. The evaluation method of the TFT according to claim 12, wherein in the TEG, a correlation of the resistance in the TEG and an overlapping position of the first conductive film or the second conductive film and the semiconductor film is obtained.

14. The evaluation method of the TFT according to claim 12, wherein the TEG has a test element for measuring resistance of the low concentration impurity region.

15. A method of manufacturing a semiconductor device characterized by having a TFT manufactured by using the evaluation method as recited in claim 12.

16. The evaluation method of the TFT according to claim 12, wherein the low concentration impurity region is provided between a channel forming region and a source region or drain region in the semiconductor film.

17. An evaluation method of a TFT comprising:
a step of forming a TEG and the TFT over a same substrate, each having a gate electrode that is laminated with a first conductive film and a second conductive film each having a taper over a semiconductor film which has a low concentration impurity region overlapping the taper of the gate electrode,
a step of measuring resistance of the low concentration impurity region of the TEG, and
estimating an impurity concentration of the low concentration impurity region of the TFT in accordance with the taper by the resistance,
wherein an edge of the first conductive film extends beyond an edge of the second conductive film, and
wherein a side edge portion of the semiconductor film is provided between the edge of the first conductive film and the edge of the second conductive film.

18. The evaluation method of the TFT according to claim 17, wherein the first conductive film having the taper is formed from a TaN film and the second conductive film having the taper is formed from a W film.

19. The evaluation method of the TFT according to claim 17, wherein a correlation of the resistance in the TEG and an overlapping position of the first conductive film or the second conductive film and the semiconductor film is obtained.

20. The evaluation method of the TET according to claim 17, wherein the TEG has a test element for measuring resistance of the low concentration impurity region.

21. A method of manufacturing a semiconductor device characterized by having a TFT manufactured by using the evaluation method as recited in claim 17.

22. The evaluation method of the TFT according to claim 17, wherein the low concentration impurity region is provided between a channel forming region and a source region or drain region in the semiconductor film.

23. An evaluation method of a TFT comprising:
a step of forming a first TEG, a second TEG, a third TEG and the TFT over a same substrate, each having a gate electrode that is laminated with a first conductive film and a second conductive film over a semiconductor film which has a low concentration impurity region overlapping the gate electrode;
a step of measuring resistance of the low concentration impurity of the first TEG;
a step of measuring resistance of a channel forming region of the second TEG;
a step of measuring resistance of an impurity region of the third TEG; and estimating impurity concentrations of the low concentration impurity region, a channel forming region and an impurity region in the TFT by the resistance, wherein a side edge portion of the semiconductor film in the first TEG is provided between an edge of the first conductive film and an edge of the second conductive film, wherein an edge of the second conductive film in the second TEG is extended beyond side edge portion of the semiconductor film, and wherein an edge of the first conductive film in the third TEG is not extended beyond a side edge portion of the semiconductor film.

24. The evaluation method of the TFT according to claim 23, wherein a plurality of the first to the third TEGs are provided.

25. The evaluation method of the TFT according to claim 23, wherein the first conductive film is formed from a TaN film and the second conductive film is formed from a W film.

26. The evaluation method of the TFT according to clam 23, wherein edges of the first conductive film and the second conductive film have a taper.

27. The evaluation method of the TFT according to claim 23, wherein a correlation of the resistance in the TEG and an overlapping position of the first conductive film or the second conductive film and the semiconductor film is obtained.

28. The evaluation method of the TFT according to claim 23, wherein the TEG has a test element for measuring resistance of the low concentration impurity region.

29. A method of manufacturing a semiconductor device characterized by having a TFT manufactured by using the evaluation method as recited in claim 23.

30. The evaluation method of the TET according to claim 23, wherein the low concentration impurity region is provided between the channel forming region and the impurity region.

* * * * *